United States Patent [19]
So et al.

[11] Patent Number: 5,939,934
[45] Date of Patent: Aug. 17, 1999

[54] INTEGRATED CIRCUIT PASSIVELY BIASING TRANSISTOR EFFECTIVE THRESHOLD VOLTAGE AND RELATED METHODS

[75] Inventors: Jason Siucheong So; Tsiu Chiu Chan, both of Carrollton, Tex.

[73] Assignee: STMicroelectronics, Inc., Carrollton, Tex.

[21] Appl. No.: 08/758,933

[22] Filed: Dec. 3, 1996

[51] Int. Cl.$^6$ .................................................... G05F 7/10
[52] U.S. Cl. .......................................... 327/534; 327/535
[58] Field of Search ..................................... 327/534–537, 327/538–544, 525

[56] References Cited

U.S. PATENT DOCUMENTS

| | | | |
|---|---|---|---|
| 4,142,114 | 2/1979 | Green ........................................ | 307/304 |
| 4,458,212 | 7/1984 | Brehmer et al. ......................... | 330/260 |
| 4,686,384 | 8/1987 | Harvey et al. ............................ | 327/525 |
| 4,903,111 | 2/1990 | Takemae et al. ......................... | 327/525 |
| 4,933,827 | 6/1990 | Olivo et al. ............................... | 363/60 |
| 4,987,088 | 1/1991 | Bergonzoni et al. ..................... | 437/34 |
| 5,099,148 | 3/1992 | McClure et al. .......................... | 307/443 |
| 5,303,189 | 4/1994 | Devin et al. ........................ | 365/189.06 |
| 5,397,934 | 3/1995 | Merrill et al. ............................ | 327/537 |
| 5,461,338 | 10/1995 | Hirayama et al. ........................ | 327/534 |
| 5,612,643 | 3/1997 | Hirayama .................................. | 327/534 |
| 5,615,151 | 3/1997 | Furuno et al. ...................... | 365/185.18 |
| 5,663,902 | 9/1997 | Bennett et al. ............................ | 365/96 |
| 5,672,995 | 9/1997 | Hirase et al. ............................. | 327/534 |

OTHER PUBLICATIONS

"Field Effect Devices", second edition, by Pierret et al., pp. 116–122, 1990.
"Solid State Electronics Devices", second edition by Streetman, pp. 310–319, 1980.

Primary Examiner—Tuan T. Lam
Attorney, Agent, or Firm—Theodore E. Galanthay; Lisa K. Jorgenson; Christopher F. Regan

[57] ABSTRACT

An integrated circuit preferably includes a plurality of enhancement-mode MOSFETs on a substrate with each MOSFET having an initial threshold voltage, and a plurality of resistors connected to define a resistor voltage divider for passively biasing the MOSFETs to produce an absolute value of an effective threshold voltage of each MOSFET to be lower than an absolute value of the initial threshold voltage. Accordingly, the effective threshold voltages may set to below a predetermined value, and lower supply voltages thereby readily accommodated. For integrated circuits having all n-channel MOSFETs, the threshold voltages are positive, and the voltage divider can be set accordingly. The invention is advantageously also used in CMOS integrated circuits having both p-channel and n-channel MOSFETs. The resistor voltage divider may preferably be set or trimmed after forming the MOSFETs. Accordingly, in one embodiment heat fusible links, are operatively connected to the first plurality of resistors for permitting selective electrical connection of predetermined ones of the resistors. In another variation, the voltage divider may be set by at least one laser trimmed resistor having a trimmed resistance to produce a desired effective threshold voltage for each MOSFET. Method aspects of the invention are also disclosed.

30 Claims, 2 Drawing Sheets

5,939,934

INTEGRATED CIRCUIT PASSIVELY BIASING TRANSISTOR EFFECTIVE THRESHOLD VOLTAGE AND RELATED METHODS

FIELD OF THE INVENTION

The present invention relates to the field of semiconductors, and more particularly, to an integrated circuit comprising a plurality of metal-oxide semiconductor field-effect transistors (MOSFETs), and related methods.

BACKGROUND OF THE INVENTION

Integrated circuits are widely used in many electronic devices. A typical relatively complicated integrated circuit may include hundreds of thousands or millions of transistors on a substrate. One type of transistor commonly used in an integrated circuit is the metal-oxide semiconductor field-effect transistor (MOSFET). A MOSFET includes source and drain regions connected by a channel. A gate overlies the channel and is separated therefrom by an insulating layer, such as typically provided by silicon dioxide ($SiO_2$). A control voltage applied to the gate controls the flow of charge carriers through the channel between the source and drain.

A depletion-mode MOSFET includes a doped or conducting channel under the gate with no voltage applied to the gate. An enhancement-mode MOSFET, in contrast, requires that a gate-to-source bias voltage be applied to create an inversion layer to serve as the conducting channel. This voltage is the threshold voltage Vt. For an n-channel enhancement-mode MOSFET a positive voltage between the gate and source induces the channel. Thus, the current will only flow when the gate-to-source voltage exceeds the threshold voltage Vt. Similarly, for a p-channel enhancement-mode MOSFET, current flows when the gate-to-source voltage is negative below the negative threshold voltage.

The threshold voltage of an enhancement-mode MOSFET is determined by a number of factors, such as the channel length, channel width, doping, gate oxide thickness, etc. Extrinsic factors, such as the ambient temperature, also affect the threshold voltage. If the Vt value is too low, the transistor may have an unacceptable leakage current if the actual supply voltage is greater than the desired supply voltage. Conversely, if the Vt is chosen relatively high, then there is a reduced likelihood that the transistor will fully switch on. Although modern semiconductor manufacturing process can be controlled, there is still a spread of Vt values across the many integrated circuit die within production runs.

It may also be desirable to use lower supply voltages for MOSFET integrated circuits to thereby reduce power consumption, such as for a cellular phone powered by a rechargeable battery, for example. Since the spread of threshold voltages based upon process variations is about the same irrespective of the supply voltage, Vt becomes a larger percentage as the supply voltage is reduced. As the supply voltage is reduced for greater speed, control over Vt and the spread thereof for the transistors becomes more critical as leakage may become unacceptable. When the supply voltages are reduced to about 1 volt or below, without accurate control of Vt, fewer and fewer integrated circuits may be acceptable as yields decrease. Analog circuits may be particularly susceptible to variations in Vt.

U.S. Pat. No. 4,142,114 to Green, for example, discloses regulation of Vt for a plurality of MOSFETs on a common substrate which is achieved by adjusting the back bias on the substrate using a charge pump that is selectively operated when the Vt of a designated enhancement-mode MOSFET falls below a reference voltage. A voltage divider provides the reference voltage that is applied to the gate of the designated enhancement-mode MOSFET, which when turned on enables the charge pump. The Vt of the designated enhancement-mode MOSFET is detected by applying a reference voltage to its gate. The charge pump raises the Vt of the MOSFETs on the substrate to within a predetermined range of a reference voltage. In other words, the patent discloses an example of so-called negative back gate bias, wherein the Vt of the transistors is raised. Unfortunately, raising the Vt reduces the available voltage headroom and prevents operating at lower supply voltages. Moreover, the sensing and charge pump circuit components include MOSFETs which have Vt's, that is, the variable to be controlled. In addition, a high effective threshold voltage may result in damage to relatively thin gate oxide layers of the MOSFETs.

U.S. Pat. No. 5,397,934 to Merrill et al. also discloses a compensation circuit for the threshold voltages of a plurality of MOSFETS on an integrated circuit die. In particular, a portion of the circuit generates a reference voltage. Threshold voltage monitoring circuitry includes a MOSFET transistor and generates a second voltage signal. Feedback circuitry compares the reference voltage to the second voltage signal and adjusts the effective threshold voltage of the MOS transistor so that the reference voltage is substantially equal to the second voltage signal. As described above, the compensation circuitry includes MOSFETs which, in turn, are subject to the variation in threshold voltage.

SUMMARY OF THE INVENTION

In view of the foregoing background, it is therefore an object of the present invention to provide an integrated circuit having MOSFETs with compensated effective threshold voltages to facilitate operation at relatively low power supply voltages.

It is another object of the present invention to provide an integrated circuit having MOSFETs with compensated effective threshold voltages, and wherein the sensing or compensation is achieved without incorporating MOSFETs having the threshold voltage.

These and other objects, advantages, and features of the present invention are provided in one embodiment by an integrated circuit preferably comprising a plurality of enhancement-mode MOSFETs on a substrate with each MOSFET having an initial threshold voltage, and a plurality of resistors connected to define a resistor voltage divider for passively biasing the plurality of MOSFETs to produce an absolute value of an effective threshold voltage of each MOSFET to be lower than an absolute value of the initial threshold voltage. Stated in somewhat different terms, the resistor voltage divider provides passive biasing means for passively biasing the plurality of MOSFETs to produce an absolute value of an effective threshold voltage of each MOSFET lower than an absolute value of the initial threshold voltage. Accordingly, the effective threshold voltages may set to below a predetermined value, and lower supply voltages thereby readily accommodated.

The resistor voltage divider can be made to draw relatively little current. In addition, the lower effective threshold voltage also permits a thinner gate oxide layer while reducing the likelihood of damaging the gate oxide. The passive resistors avoid the use of transistors which may be affected by the variable, threshold voltage, which is to be controlled.

For integrated circuits having all n-channel MOSFETs, the threshold voltages are positive, and the voltage divider can be set accordingly. The invention is advantageously also used in CMOS integrated circuits having both p-channel and n-channel MOSFETs. In the CMOS embodiment, a first plurality of resistors may be connected to define a first voltage divider biasing the respective p-tubs or wells of the n-channel MOSFETs to produce an effective threshold voltage of each n-channel MOSFET lower than the initial positive threshold voltage. Similarly, a second plurality of resistors may be connected to define a second voltage divider biasing the respective n-tubs of the p-channel MOSFETs to produce an absolute value of effective threshold voltages to be lower than an absolute value of initial negative threshold voltages.

The resistor voltage divider may preferably be set after forming the MOSFETs. Accordingly, in one embodiment fusing means, such as provided by heat fusible links, is operatively connected to the first plurality of resistors for permitting selective electrical connection of predetermined ones of the resistors. In another variation, the voltage divider may be set by at least one trimmed resistor having a trimmed resistance to produce a desired effective threshold voltage for each MOSFET.

Another aspect of the invention is that the initial threshold voltages may be desirably set high in the manufacturing process. Trimming the voltage divider brings the threshold voltages down to the desired level. In other words, the MOSFETS may have a spread of low to high initial threshold voltages, and wherein the voltage divider biases the MOSFETS so that a spread of low to high effective threshold voltages has a high effective threshold voltage less than or equal to the low initial threshold voltage. Accordingly, the integrated circuit of the invention may reliably operate with a power supply voltage of less than about three volts, for example, and the integrated circuit can be readily manufactured to produce high yields.

A method aspect of the invention is for making an integrated circuit. The method preferably comprises the steps of: forming a plurality of enhancement-mode MOSFETs on a substrate with each MOSFET having an initial threshold voltage; and passively biasing the plurality of MOSFETs to produce an absolute value of an effective threshold voltage of each MOSFET lower than an absolute value of the initial threshold voltage. The step of forming the plurality of MOSFETs preferably comprises forming at least one of n-channel and p-channel MOSFETs. The step of passively biasing may comprise the steps of: connecting a plurality of resistors to define a voltage divider for passively biasing the plurality of MOSFETs, and trimming the resistance to provide the desired biasing.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Prime notation is used to indicate similar elements in alternate embodiments.

Figure 1:
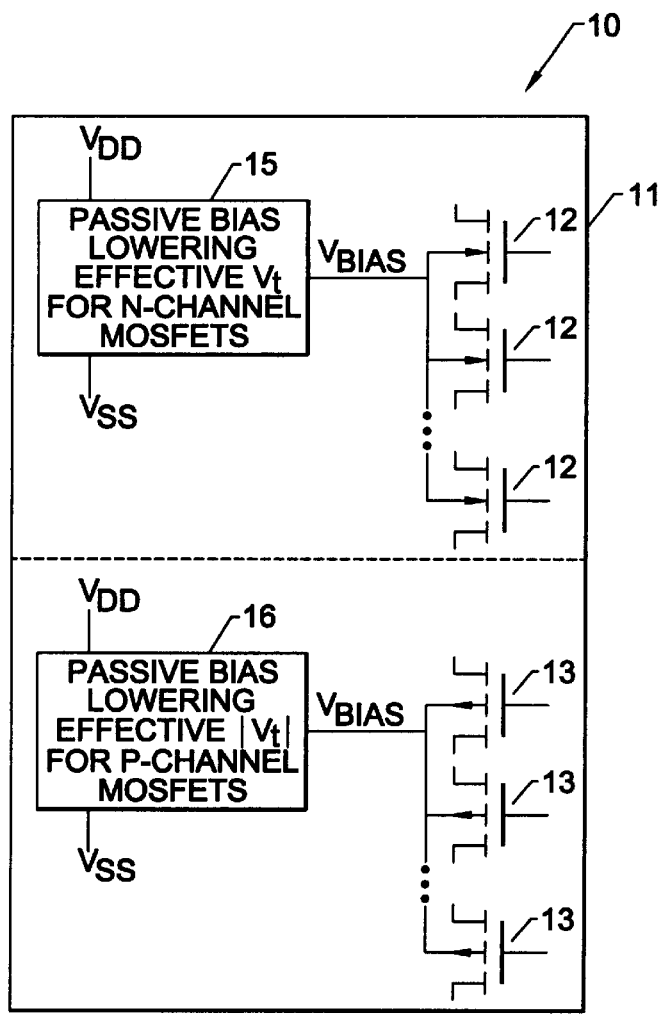
FIG. 1 is a schematic diagram of a CMOS integrated circuit embodiment in accordance with the present invention.

Referring first to FIG. 1 an integrated circuit 10 in accordance with the present invention is first described. The integrated circuit 10 includes a substrate 11 on which a plurality of enhancement-mode MOSFETs are formed as would be readily understood by those skilled in the art. The illustrated integrated circuit 10 includes both p-channel MOSFETs 13 and n-channel MOSFETs 12 in a CMOS circuit as would also be readily understood by those skilled in the art.

Each n-channel and p-channel MOSFET 12, 13 has an initial threshold voltage $Vt_{INI}$ dependent at least in part on design parameters and processing variations. First passive biasing means 15 is provided for passively biasing the p-tubs of the n-channel MOSFETs 12 with a voltage $V_{BIAS}$ to produce an effective threshold voltage $Vt_{EFF}$ of each MOSFET lower than the initial positive threshold voltage. The lower portion of FIG. 1 illustrates passive biasing for the p-channel MOSFETs 13. In particular, second passive biasing means 16 provides a $V_{BIAS}$ to bias the n-tubs of the p-channel MOSFETs 13 to produce an effective threshold voltage $Vt_{EFF}$ having an absolute value less than the absolute value of the negative initial threshold voltage $Vt_{INI}$.

Accordingly, the effective threshold voltages may set to below a predetermined value, and lower supply voltages ($V_{DD}$) thereby readily accommodated. In addition, the lower effective threshold voltages $Vt_{EFF}$ also permit a thinner gate oxide layer, while reducing the likelihood of damaging the gate oxide. The thinner gate oxide may permit higher operating speeds.

As would be readily understood by those skilled in the art, the passive biasing arrangement of the present invention may be included for an integrated circuit including only n-channel or p-channel MOSFETs. In addition, the passive biasing arrangement may only be needed on one or the other of n-channel or p-channel MOSFETs where both types of transistors are included in the integrated circuit. For example, the passive biasing to produce a lowered $Vt_{EFF}$ may be used only on the n-channel transistors, even where p-channel devices are also included.

Figure 2:
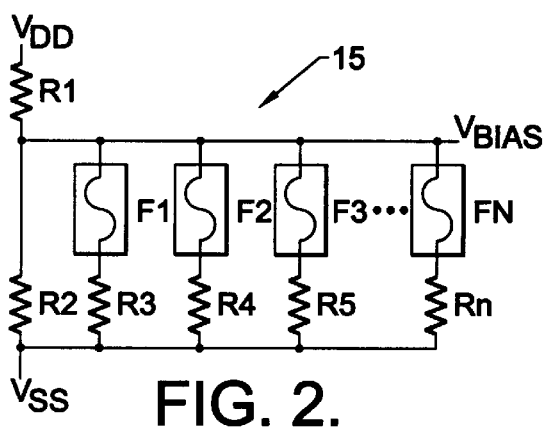
FIG. 2 is a schematic circuit diagram of a first embodiment of a passive bias circuit portion of the integrated circuit in accordance with the present invention.

As understood with additional reference to FIG. 2, an embodiment of passive biasing means 15 is illustrated by the resistor voltage divider connected between the positive supply voltage $V_{DD}$ and ground $V_{SS}$. The voltage divider illustratively includes a plurality of resistors R1–Rn connected for generating the biasing voltage VBIAS. Resistors R1 and R2 define a maximum $V_{BIAS}$ for the divider as would occur if all of the heat fusible links F1 through Fn were open. If all of the heat fusible links F1 through Fn were left intact, the minimum $V_{BIAS}$ would be produced by the voltage divider 15. In other words, the fusible links F1 to Fn permit fine tuning or selection of the $V_{BIAS}$ to produce the desired effective threshold voltage $Vt_{EFF}$ for the MOSFETs as described in greater detail below.

The heat fusible links F1 to Fn may be opened by selective laser heating, for example, as would be readily understood by those skilled in the art. In addition, the position of selectable resistors R3 to Rn and their associated fusible links may switched to be connected in parallel with resistor R1 rather than resistor R2 as in the illustrated embodiment. The values of the resistors may be selected to provide a graduated change in the bias voltage $V_{BIAS}$ as would be readily understood by those skilled in the art. The total resistance of the voltage divider can be selected to be greater than about 100 Kohms to reduce static current draw downward in into the microamp range. The resistance values could be higher to further reduce the current draw with trade-off being the use of more space on the integrated circuit substrate for the larger value resistors.

Figure 3:
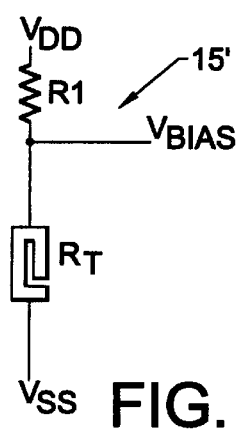
FIG. 3 is a schematic circuit diagram of a second embodiment of a passive bias circuit portion of the integrated circuit in accordance with the present invention.

Turning now additionally to FIG. 3, another embodiment of passive biasing means 15' is shown by the illustrated voltage divider. In this embodiment a laser trimmed resistor $R_T$ is provided in one leg of the voltage divider to permit selection of the bias voltage $V_{BIAS}$ as would be readily appreciated by those skilled in the art.

Figure 4:
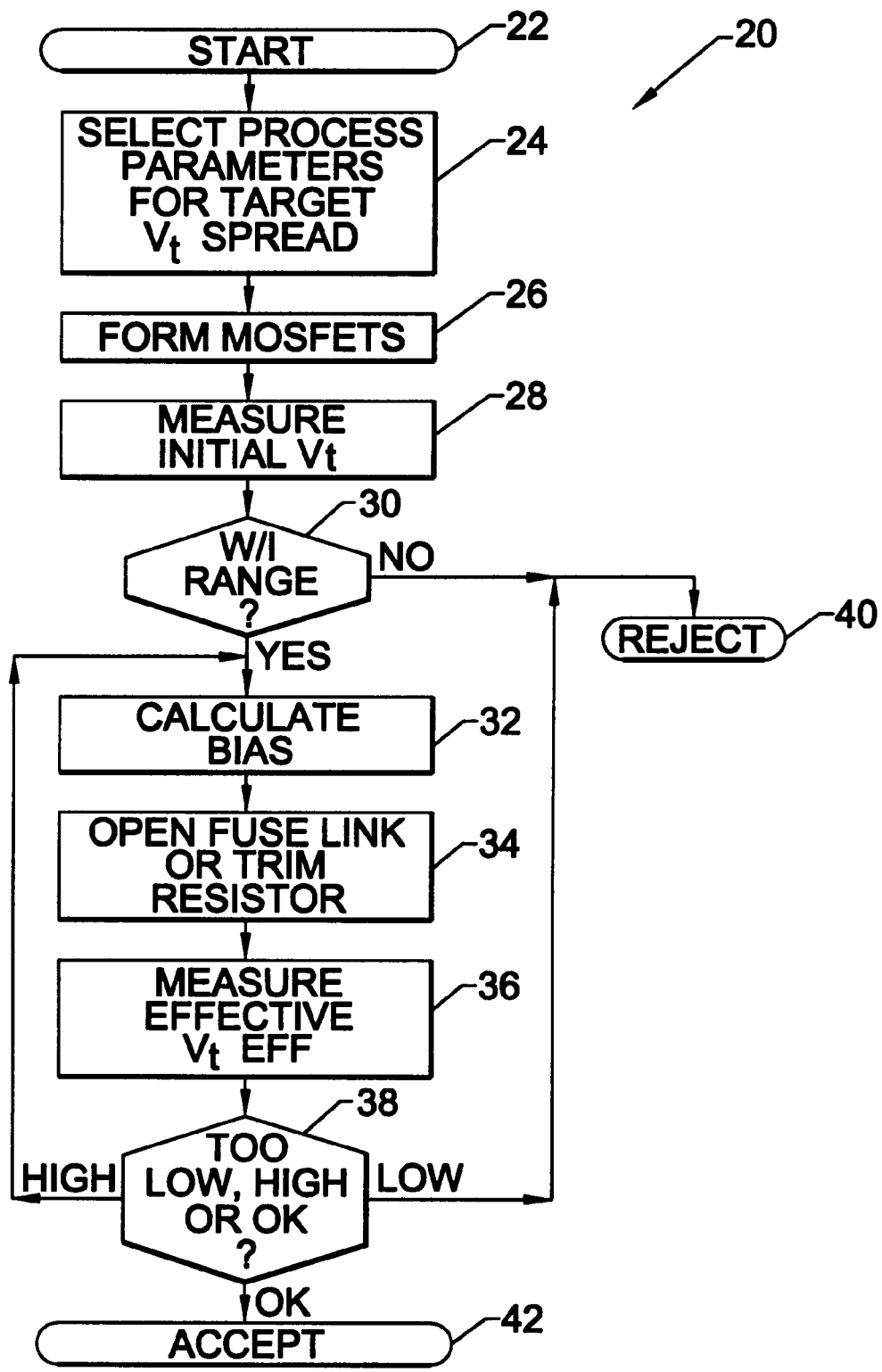
FIG. 4 is a flow chart for the method in accordance with the present invention.

The method of the present invention may be understood with additional reference to the flow chart 20 of FIG. 4. From the start (Block 22) the process and design parameters are selected to produce a target spread of low and high threshold voltages for the plurality of MOSFETs at Block 24. For example, the target low may be 0.45 volts and the target high may be 0.65 volts. The MOSFETs are formed by conventional semiconductor manufacturing techniques as would be readily understood by those skilled in the art (Block 26). One or more test or active MOSFETs may be measured to determine initial threshold voltages $Vt_{INI}$ at Block 28.

If the measured $Vt_{INI}$ is within a predetermined allowable range as determined at Block 30, an amount of bias is calculated at Block 32. If the measured $Vt_{INI}$ is not acceptable (Block 30) the integrated circuit is rejected (Block 40). Upon determination of the desired bias, one or more fusible links may be opened or the resistor trimmed to set the voltage divider to generate the desired bias (Block 34). The effective threshold voltage $Vt_{EFF}$ can be measured and checked at Blocks 36 and 38, respectively. If $Vt_{EFF}$ is too low, the integrated circuit may be rejected (Block 40). If $Vt_{EFF}$ is too high, the calculating and bias adjusting steps can be repeated (Blocks 32 to 38). Finally, if the VtEFF is acceptable, the integrated circuit is accepted (Block 42).

The initial threshold voltages may be desirably targeted high in the manufacturing process. Trimming the voltage divider brings the threshold voltages down to the desired level. In other words, the MOSFETS may have a spread of low to high initial threshold voltages, and wherein the voltage divider biases the MOSFETS so that a spread of low to high effective threshold voltages has a high value less than or equal to the low initial threshold voltage.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit comprising:
    a substrate;
    a plurality of enhancement-mode metal-oxide semiconductor field-effect transistors (MOSFETs) on said substrate, and each MOSFET having an initial threshold voltage; and
    passive biasing means for continuously passively biasing the plurality of MOSFETs, said passive biasing means comprising a plurality of resistors connected to define a resistor voltage divider, the resistor voltage divider being directly connected to bodies of said plurality of MOSFETs to produce an absolute value of an effective threshold voltage of each MOSFET lower than an absolute value of the initial threshold voltage.

2. An integrated circuit according to claim 1 wherein said plurality of MOSFETs comprise at least one of n-channel and p-channel MOSFETs.

3. An integrated circuit according to claim 1 wherein said passive biasing means further comprises fusing means operatively connected to said plurality of resistors for permitting selective electrical connection of predetermined ones thereof to produce a desired absolute value of the effective threshold voltage for each MOSFET.

4. An integrated circuit according to claim 3 wherein said fusing means comprises a plurality of heat fusible links.

5. An integrated circuit according to claim 1 wherein said plurality of resistors comprises at least one trimmed resistor having a trimmed resistance to produce a desired absolute value of the effective threshold voltage for each MOSFET.

6. An integrated circuit according to claim 1 wherein said plurality of MOSFETS has a spread of low to high absolute values of initial threshold voltages, and wherein said passive biasing means passively biases the MOSFETS so that a spread of low to high absolute values of effective threshold voltages has a high effective threshold voltage less than or equal to the low absolute value of initial threshold voltage.

7. An integrated circuit according to claim 1 wherein said plurality of MOSFETS are operable from a voltage supply of less than about three volts.

8. An integrated circuit according to claim 1 wherein said plurality of resistors define the resistor voltage divider to have a combined resistance of not less than about 100 Kohms.

9. An integrated circuit comprising:
    a substrate;
    a plurality of enhancement-mode metal-oxide semiconductor field-effect transistors (MOSFETs) on said substrate, said plurality of MOSFETS having a spread of low to high absolute values of initial threshold voltages; and
    a plurality of resistors connected to define a resistor voltage divider, the resistor voltage divider being directly connected to bodies of said plurality of MOSFETs for continuously passively biasing the plurality of MOSFETs with a constant selected bias voltage to produce a spread of low to high absolute values of effective threshold voltages having a high absolute value of effective threshold voltage less than or equal to the low absolute value of initial threshold voltage.

10. An integrated circuit according to claim 9 wherein said plurality of MOSFETs comprise at least one of n-channel and p-channel MOSFETs.

11. An integrated circuit according to claim 9 further comprising fusing means operatively connected to said plurality of resistors for permitting selective electrical connection of predetermined ones thereof.

12. An integrated circuit according to claim 11 wherein said fusing means comprises a plurality of heat fusible links.

13. An integrated circuit according to claim 9 wherein said plurality of resistors comprises at least one trimmed resistor having a trimmed resistance.

14. An integrated circuit according to claim 9 wherein said plurality of MOSFETs are operable from a voltage supply of less than about three volts.

15. An integrated circuit according to claim 9 wherein said plurality of resistors define the resistor voltage divider to have a combined resistance of not less than about 100 Kohms.

16. An integrated circuit comprising:

a substrate;

a plurality of enhancement-mode n-channel metal-oxide semiconductor field-effect transistors (MOSFETs) on said substrate, and each n-channel MOSFET comprising a p-tub and having an initial positive threshold voltage;

a first plurality of resistors connected to define a first resistor voltage divider, the first resistor voltage divider being directly connected to bodies of said plurality of enhancement-mode n-channel MOSFETs for continuously biasing the respective p-tubs of the n-channel MOSFETs with a constant selected bias voltage to produce an effective threshold voltage of each n-channel MOSFET lower than the initial positive threshold voltage;

a plurality of enhancement-mode p-channel MOSFETs on said substrate, and each p-channel MOSFET comprising an n-tub and having an initial negative threshold voltage; and a second plurality of resistors connected to define a second resistor voltage divider, the second resistor voltage divider being directly connected to bodies of said plurality of enhancement-mode p-channel MOSFETs for continuously biasing the respective n-tubs of the p-channel MOSFETs with a constant selected bias voltage to produce an absolute value of an effective threshold voltage of each p-channel MOSFET lower than an absolute value of the initial negative threshold voltage.

17. An integrated circuit according to claim 16 further comprising:

first fusing means operatively connected to said first plurality of resistors for permitting selective electrical connection of predetermined ones thereof to produce a desired effective threshold voltage for each n-channel MOSFET; and second fusing means operatively connected to said second plurality of resistors for permitting selective electrical connection of predetermined ones thereof to produce a desired absolute value of effective threshold voltage for each p-channel MOSFET.

18. An integrated circuit according to claim 17 wherein said first fusing means comprises a first plurality of heat fusible links; and wherein said second fusing means comprises a second plurality of heat fusible links.

19. An integrated circuit according to claim 16 wherein said first plurality of resistors comprises at least one trimmed resistor having a trimmed resistance to produce a desired effective threshold voltage for each n-channel MOSFET; and wherein said second plurality of resistors comprises at least one trimmed resistor having a trimmed resistance to produce a desired absolute value of effective threshold voltage for each p-channel MOSFET.

20. An integrated circuit according to claim 16 wherein said first plurality of n-channel MOSFETs has a spread of low to high initial positive threshold voltages, and wherein said first voltage divider biases the respective p-tubs of the n-channel MOSFETs so that a spread of low to high effective threshold voltages has a high effective threshold voltage less than or equal to the low initial positive threshold voltage.

21. An integrated circuit according to claim 16 wherein said second plurality of p-channel MOSFETs has a spread of low to high absolute values of initial negative threshold voltages, and wherein said second resistor voltage divider biases the respective n-tubs of the p-channel MOSFETs so that a spread of low to high absolute values of effective threshold voltages has a high absolute value of effective threshold voltage less than or equal to the low absolute value of the initial negative threshold voltage.

22. An integrated circuit according to claim 16 wherein said first and second pluralities of MOSFETs are operable from a voltage supply of less than about three volts.

23. An integrated circuit according to claim 16 wherein said first plurality of resistors define the first resistor voltage divider to have a combined resistance of not less than about 100 Kohms; and wherein said second plurality of resistors define the second resistor voltage divider to have a combined resistance of not less than about 100 Kohms.

24. A method for making an integrated circuit comprising the steps of:

forming a plurality of enhancement-mode metal-oxide semiconductor field-effect transistors (MOSFETs) on a substrate with each MOSFET having an initial threshold voltage; and connecting a plurality of resistors to define a resistor voltage divider and directly connecting the resistor voltage divider to bodies of the plurality of MOSFETs for continuously passively biasing the plurality of MOSFETs with a constant selected bias voltage to produce an absolute value of an effective threshold voltage of each MOSFET lower than an absolute value of the initial threshold voltage.

25. A method according to claim 24 wherein the step of forming the plurality of MOSFETs comprises forming at least one of n-channel and p-channel MOSFETs.

26. A method according to claim 24 wherein the step of passively biasing further comprises the step of disconnecting predetermined ones of said plurality of resistors to produce a desired absolute value of effective threshold voltage for each MOSFET.

27. A method according to claim 26 wherein the step of disconnecting comprises heating fusible links connecting predetermined ones of said resistors.

28. A method according to claim 24 wherein the step of passively biasing said plurality of MOSFETs comprises trimming at least one trimmable resistor of said plurality of resistors to produce a desired absolute value of the effective threshold voltage for each MOSFET.

29. A method according to claim 24 wherein the step of forming the plurality of MOSFETs further comprises forming the plurality of MOSFETs to have a spread of low to high absolute values of initial threshold voltages, and wherein the step of passively biasing the plurality of MOSFETs comprises passively biasing the plurality of MOSFETs so that a spread of low to high absolute values of effective threshold voltages has a high absolute value of effective threshold voltage less than or equal to the low absolute value of initial threshold voltage.

30. A method according to claim 24 further comprising the step of measuring the absolute value of initial threshold voltage.

* * * * *